US011214159B2

(12) United States Patent
Heyne et al.

(10) Patent No.: US 11,214,159 B2
(45) Date of Patent: Jan. 4, 2022

(54) CHARGING SYSTEM HAVING AN INTEGRATED COOLANT RESERVOIR

(71) Applicant: Ing. h.c. F. Porsche Aktiengesellschaft, Stuttgart (DE)

(72) Inventors: Raoul Heyne, Wiernsheim (DE); Florian Joslowski, Leinfelden-Echterdingen (DE)

(73) Assignee: Dr. Ing. h.c. F. Porsche Aktiengesellschaft

( * ) Notice: Subject to any disclaimer, the term of this patent is extended or adjusted under 35 U.S.C. 154(b) by 153 days.

(21) Appl. No.: 16/267,859

(22) Filed: Feb. 5, 2019

(65) Prior Publication Data

US 2019/0255961 A1    Aug. 22, 2019

(30) Foreign Application Priority Data

Feb. 20, 2018   (DE) .......................... 102018103706.6

(51) Int. Cl.
| | |
|---|---|
| *B60L 53/302* | (2019.01) |
| *B60L 53/31* | (2019.01) |
| *B60L 53/16* | (2019.01) |
| *H05K 7/20* | (2006.01) |
| *B60L 53/53* | (2019.01) |
| *B60L 53/14* | (2019.01) |

(52) U.S. Cl.
CPC ............ *B60L 53/302* (2019.02); *B60L 53/14* (2019.02); *B60L 53/16* (2019.02); *B60L 53/31* (2019.02); *B60L 53/53* (2019.02); *H05K 7/20272* (2013.01); *H05K 7/20927* (2013.01)

(58) Field of Classification Search
CPC ........ B60L 53/302; B60L 53/31; B60L 53/16; B60L 53/14; H05K 7/20272; H05K 7/20927
USPC ....................................................... 320/109
See application file for complete search history.

(56) References Cited

U.S. PATENT DOCUMENTS

| | | | |
|---|---|---|---|
| 8,350,526 B2 * | 1/2013 | Dyer ....................... | B60L 53/31 |
| | | | 320/109 |
| 9,260,025 B1 | 2/2016 | McGrath | |
| 9,586,497 B2 * | 3/2017 | Epstein ................... | B60L 58/24 |
| 10,131,239 B2 | 11/2018 | Herke et al. | |
| 2009/0273310 A1 * | 11/2009 | Flack ..................... | B60L 53/302 |
| | | | 320/107 |
| 2010/0291419 A1 * | 11/2010 | Zhou ................... | H01M 10/613 |
| | | | 429/50 |

(Continued)

FOREIGN PATENT DOCUMENTS

| | | |
|---|---|---|
| CN | 206344701 U | 7/2017 |
| DE | 102015110023 A1 | 12/2016 |
| DE | 102015222703 A1 | 5/2017 |

*Primary Examiner* — Richard Isla
*Assistant Examiner* — Dung V Bui
(74) *Attorney, Agent, or Firm* — RatnerPrestia

(57) ABSTRACT

A charging system for charging an electric vehicle is provided. The charging system includes a charging station, at least one charging connector, which is able to be coupled to the electric vehicle in order to charge same, a buffer storage device for storing energy, power electronics that are configured to provide the energy from the buffer storage device and/or from a mains connection to the charging station at the at least one charging connector, and a coolant reservoir in which a coolant for cooling the power electronics is stored.

13 Claims, 3 Drawing Sheets

(56) References Cited

U.S. PATENT DOCUMENTS

| | | | |
|---|---|---|---|
| 2011/0049992 A1* | 3/2011 | Sant'Anselmo | H02S 10/12 307/64 |
| 2011/0096496 A1* | 4/2011 | Doo | H05K 7/20927 361/689 |
| 2012/0043935 A1 | 2/2012 | Dyer et al. | |
| 2012/0043943 A1* | 2/2012 | Dyer | B60L 58/26 320/137 |
| 2013/0020993 A1* | 1/2013 | Taddeo | B60L 53/16 320/109 |
| 2013/0069592 A1* | 3/2013 | Bouman | B60L 53/302 320/109 |
| 2013/0076294 A1* | 3/2013 | Smith | H02J 7/0027 320/101 |
| 2013/0113413 A1* | 5/2013 | Harty | H01M 10/46 320/101 |
| 2013/0244077 A1* | 9/2013 | Palanchon | H01M 10/61 429/120 |
| 2013/0307477 A1* | 11/2013 | Reinschke | B60L 11/1824 320/109 |
| 2013/0314037 A1* | 11/2013 | Caffy | H02J 7/0071 320/109 |
| 2015/0054460 A1 | 2/2015 | Epstein et al. | |
| 2017/0088005 A1* | 3/2017 | Christen | B60L 11/1874 |
| 2017/0096073 A1 | 4/2017 | Mardall et al. | |
| 2017/0106764 A1* | 4/2017 | Beaston | H02J 7/0027 |

* cited by examiner

CHARGING SYSTEM HAVING AN INTEGRATED COOLANT RESERVOIR

CROSS-REFERENCE TO RELATED APPLICATION

This application claims priority to German Patent Application No. DE 10 2018 103 706.6, filed Feb. 20, 2018, which is incorporated by reference herein in its entirety.

FIELD OF THE INVENTION

The present invention relates in general to a charging system having an integrated coolant reservoir. The charging system may be in particular a charging system incorporating an electric buffer storage device for charging electric vehicles and a reservoir for a liquid coolant.

BACKGROUND OF THE INVENTION

Electromobility has taken on increasing importance in recent years. To promote the proliferation of electric vehicles, it is desirable for the charging procedure for an electric vehicle to be quick, uncomplicated and possible at any time. Nowadays, modern electric vehicles are able to be charged with charging powers beyond 100 kW, with charging currents in the region of 300 amperes and more. The power electronics in the charging station transform the current and the voltage from a mains connection, such that the current and the voltage at the charging plugs have the appropriate form (DC or AC) and magnitude for being able to charge an electric vehicle. In the case of the high charging currents that arise during the charging procedure, cooling of the power electronics is essential, since otherwise the power electronics may be damaged by overheating at relatively high external temperatures and in particular as the number of charging procedures increases, with consequences on the operator side and user side that are obviously disadvantageous.

In the numerous different charging stations that are in use worldwide, a very wide variety of cooling systems are used. The structure and the design of the cooling units vary accordingly. In the case of most modern charging columns, the power electronics are air-cooled. Properly functioning air cooling is however only able to be implemented if the installation space for the charging column is relatively large and there is enough space for corresponding air stream guidance.

One alternative to air cooling is liquid cooling, in which, instead of air, a liquid constitutes the heat-absorbing medium. On account of the specific heat capacity, which is usually considerably higher, liquid cooling may prove to be more compact and still provide a high cooling capacity. Common liquid cooling systems are usually equipped with a heat exchanger and an overpressure vessel. The latter ensures that, in the case of temperature fluctuations and related density fluctuations in the cooling liquid, there is always enough cooling liquid and also of the cooling system present in the cooling circuit.

US 2012/0043935, which is incorporated by reference herein, thus describes a charging column having a cooling device arranged therein, which, during charging, transfers cooling liquid to the vehicle in order to cool the vehicle battery. US 2013/0307477, which is incorporated by reference herein, discloses a tank that has an of the electrical components required to perform the charging procedure. The tank is configured such that as heat-emitting elements, that is to say in particular the electrical and electronic components, transfer their heat to the tank wall. US 2015/0054460, which is incorporated by reference herein, discloses a charging column having a battery for the rapid charging of an electric vehicle. The charging column contains a liquid-operated temperature control system by way of which cooling with respect to the vehicle or with respect to the battery thereof is performed, on the one hand, and also cooling of the internal battery for the purpose of rapid charging is carried out, on the other hand, CN 206344701, which is incorporated by reference herein, describes a charging column having a cooling system, which cooling system includes a solar cell having a water tank arranged above the external housing of the charging column. To cool the charging column, water is sprayed over the outer housing of the charging column. In addition, remote monitoring of temperature and of air humidity is proposed. Lastly, DE 10 2015 222703, which is incorporated by reference herein, describes a charging station, which, in addition to providing electrical energy, also includes a fluid-based temperature control device for controlling the temperature of the energy storage of the motor vehicle.

Starting from charging columns for electric vehicles that are known from the prior art, described herein is a charging station having an efficient cooling system that provides cold over a plurality of charging procedures, which cooling system is furthermore as quiet as possible such that users are not excessively disturbed by noise during a charging procedure.

SUMMARY OF THE INVENTION

According to aspects of the invention, a charging system for charging an electric vehicle is provided, which charging system includes a charging station, at least one charging connector, which is able to be coupled to the electric vehicle in order to charge same or is able to be connected thereto, a buffer storage device for storing energy, power electronics that are configured to provide the energy from the buffer storage device and/or from a mains connection to the charging station at the at least one charging to connector, and a coolant reservoir in which a coolant is stored, wherein the coolant is used to cool the power electronics.

The charging system according to aspects of the invention may generally be in the form of a modular system and include a charging station and at least one charging column that is separate therefrom and that may include one or more charging plugs. As an alternative, the charging system may be configured as a combined system and have a main housing in which the power electronics, the buffer storage device and the coolant reservoir are situated, wherein the at least one charging plug may be arranged on the main housing. The buffer storage device may be an appropriately dimensioned rechargeable battery or battery arrangement that provides the energy required to perform the charging procedures. The capacity of the buffer storage device, per charging plug, may be in the range from around 50 kWh to around 500 kWh. The buffer storage device may in particular be designed such that motor vehicles are able to be charged at the charging system according to aspects of the invention with charging powers that exceed the power of the mains connection connected to the charging system. It is possible to use only the energy present in the buffer storage device for a charging procedure, that is to say without the charging procedure being dependent on a flow of energy from the mains connection at the time of charging. The buffer storage device may thus function as an energy buffer and thus enable charging procedures with powers higher than those of the mains connection. The buffer storage device may however also function as an energy storage device and provide all of the energy transferred during a charging procedure. The charging procedures at the charging system according to aspects of the invention are therefore independent of the power of the connected mains. The power electronics arranged in the charging system regulate the current conversion (current intensity, current voltage and possibly current type (DC or AC)) between the buffer storage device (or possibly mains connection) and charging plug(s) of the charging system. The charging system may be connected to the mains via the mains connection. The charging system according to aspects of the invention may generally be configured such that vehicles are able to be charged at it using current from the mains and using current from the buffer storage device, wherein the proportion of the currents in the case of a charging procedure taking place from each of the two sources may be between 0% and 100%.

The charging station of the charging system according to aspects of the invention to furthermore includes a coolant reservoir in which the coolant used to cool the power electronics is provided. The coolant reservoir is arranged inside the charging system and coupled to a fluid-mechanical temperature control system, for example to a piping system having heat sinks, such that, overall, there is a fully fledged active cooling system for dissipating the power loss converted into heat from the power electronics. The fluid-mechanical temperature control system may include further components that are conventional in a coolant circuit, such as for example a pump, a radiator and a compensation tank. The power electronics are generally able to be cooled directly by way of cooling elements attached to the power electronics elements and/or indirectly by way of a heat exchanger that is arranged at the location of the power electronics and that cools air flowing around the power electronics.

Owing to suitable design of the coolant reservoir, the charging system according to aspects of the invention is able to be provided with enough cooling capacity also to operate safely and reliably at warm external temperatures. The cooling capacity is not obtained solely from a greater exchange of heat with the surroundings, but also from the temperature gradients between the coolant and the component to be cooled. Relatively low-noise cooling is thus able to be achieved, which cooling is based for example on air blowers that are barely audible as they are operated at low rotational speeds. It is also possible to avoid generating very hot waste heat (exhaust air) that is ejected directly out of the charging station when a plurality of charging procedures take place one after another and/or in parallel with one another, meaning that more waste heat has to be dissipated, or when the external temperature increases. Owing to good thermal decoupling of the coolant reservoir from the external surroundings, the coolant is for example able to be cooled at a constant rate, for example by way of an aerated condenser. The coolant reservoir, to this extent, may be considered to be a buffer for waste heat spikes, and therefore enables the use of a remaining part of the cooling system that is dimensioned so as to be smaller overall (in comparison with a cooling system without the coolant reservoir), by way of which the waste heat from the charging system is output to the surroundings. In other words, the coolant reservoir ensures that, when the charging system according to aspects of the invention alternates between being used and not being used, cooling of the power electronics takes place in a continuously smoothed manner. The coolant reservoir may thus be considered to be a body that, in relation to the waste heat emitted during a charging procedure for an electric vehicle, is able to absorb large amounts of heat. The waste heat from the charging system is absorbed and output to the surroundings in a metered manner, as it were. In one appropriate design, the coolant reservoir additionally offers enough absorption capacity for heat that is to be dissipated, such that sufficient cooling capacity is also able to be made available with a time delay. This may mean, inter alia, that the entire cooling capacity is available not just at the beginning of a charging procedure, but rather the coolant reservoir is likewise also able to provide cooling capacity during further or subsequent charging procedures. If for example the charging system is to be equipped with a maximum of 10 kW cooling capacity, then the coolant reservoir may for example be designed for 4 kW cooling capacity, such that the remaining cooling system, which conventionally dissipates the exhaust air from the power electronics to the surroundings, only need be designed for 6 kW instead of for 10 kW. The coolant reservoir may then for example be "regenerated" in rest phases, that is to say cooled back to its base temperature. A rest phase may be understood to mean a phase in which no or only very little waste heat needs to be dissipated from the charging station. In particular, there could be more rest phases during the night, as fewer charging procedures normally take place then, on the one hand, and also the external temperature decreases in comparison to during the day, such that the output of heat to the external surroundings by way of heat exchangers is performed more efficiently. In this context, the coolant reservoir may thus be considered to be a smoothing element: in the case of a high charging load at the charging system, it is able to provide cooling capacity, and in the case of a low charging load at the charging system, it is able to be regenerated again.

According to another embodiment of the charging system, the coolant may also additionally be used to cool the buffer storage device. The buffer storage device may thus be cooled in the same way as the power electronics. The buffer storage device is able to be cooled directly by way of cooling elements attached to the buffer storage device or indirectly by way of a heat exchanger that is arranged near or in the region of the buffer storage device and that cools air flowing around the buffer storage device.

According to another embodiment, the charging system may furthermore include at least one charging column that is electrically coupled to the charging station, wherein the at least one charging connector is provided on the charging column. The charging column may be electrically coupled to the charging station by way of a line and, in a manner separated therefrom, positioned at a distance (for example 50 meters or 100 meters) therefrom. In another embodiment, the charging column may also be thermally connected to the charging station, such that the cooling system of the charging station undertakes cooling of the charging column. Such an embodiment may have the advantage that the charging column is able to be constructed in a very compact and unobtrusive manner, as the power electronics and the buffer storage device are arranged centrally in the charging station. The charging column may then include just the charging plug and an operating terminal, as it were. In one particularly suitable embodiment, the charging column may additionally include a heat exchanger that transfers the cooling from the charging station to a separate cooling circuit for the charging cable so that less special coolant is able to be used for this cooling circuit.

According to another embodiment of the charging system, the coolant may be water. The coolant reservoir may therefore include a water tank. Various additives may be added to the water that is used, these additives increasing the functionality of the water, for example corrosion protection and/or frost protection.

According to another embodiment of the charging system, the coolant reservoir may be arranged underground. Underground installation of the coolant reservoir may protect it against solar irradiation and utilize the averaging or temperature control effect of the ground as a whole (that is to say cooler than the usual air temperatures (for example 30° C.) in summer and warmer than the usual air temperatures (for example −5° C.) in winter). The charging station of the charging system according to aspects of the invention may for example include an overground part and an underground part, wherein the underground part is largely able to be thermally insulated from the overground part. The underground part and the overground part may structurally form one unit or else also be structurally separate from one another and be connected to one another only by corresponding coolant pipes or parts of the liquid cooling system and power lines. The buffer storage device may be arranged in the overground part in the form of a battery arrangement. In another embodiment, however, at least part of the buffer storage device of the charging station may also be installed underground, in order to utilize the temperature-conditioning effect of the ground for this part as well. The underground part of the charging station according to aspects of the invention thus includes at least the coolant reservoir and may furthermore expediently also include fluid-mechanical elements of the coolant cooling system, such as for example a compressor and/or pumps, and possibly at least part of the buffer storage device. Blowers may be provided in the overground part of the charging station, which blowers are assigned to the liquid cooling system and assist a transfer of heat from a condenser of the cooling system to the surroundings.

According to another embodiment of the charging system, the charging connector may include a coolant line that is coupled directly or indirectly via a heat exchanger to the coolant reservoir in order to actively cool the charging connector, in particular during a charging procedure that is taking place. This means that the coolant line inside the charging connector, that is to say inside the charging cable, which connects a charging plug (the charging plug itself also being able to be cooled) to the charging station or the charging column, is not insulated, but rather is designed to transfer heat or cold between the coolant line and the charging power cables running in the charging connector. The coolant line may not be a largely non-insulated transport line that is not used exclusively to transport the coolant from the coolant reservoir to the cooling system of the electric vehicle, as is known from the prior art.

According to another embodiment of the charging system, the coolant reservoir may have a capacity of an order of magnitude of around 200 liters or more per charging connector. As a result, the coolant reservoir may provide enough cooling capacity and serve as primary cooling source for the buffer storage device and the power electronics.

According to another embodiment of the charging system, the cooling system may also be operated as a heating system and, where necessary, output the energy stored in the coolant reservoir in relation to the surrounding temperature in the form of heat to components of the charging system. By way of example, the charging cable may thus be heated in winter such that it remains flexible. To this extent, the cooling system may be considered to be a temperature control system that is able to prevent excessively cold and excessively hot temperatures of the components whose temperature is able to be controlled thereby.

Further advantages and refinements of the invention will emerge from the description and from the appended drawings.

It is self-evident that the features mentioned above and the features yet to be discussed below may be used not only in the respectively specified combination but also in other combinations or individually without departing from the scope of the present invention.

BRIEF DESCRIPTION OF THE DRAWING

The invention is schematically illustrated in the drawings with reference to embodiments and is described schematically and in detail with reference to the drawings.

DETAILED DESCRIPTION OF THE INVENTION

Figure 1:
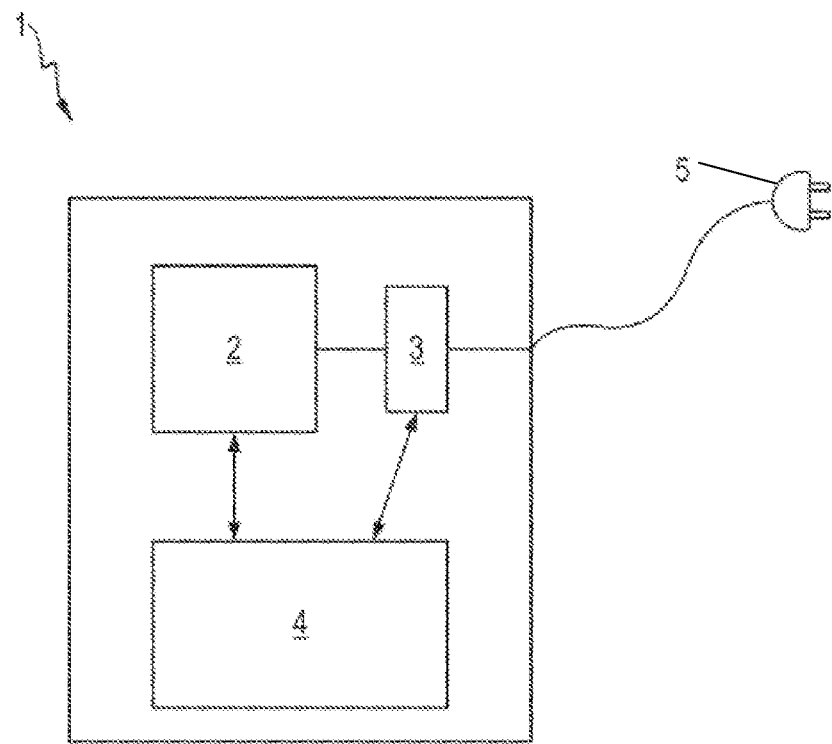
FIG. 1 shows a schematic view of a charging system according to various exemplary embodiments.

FIG. 1 shows a schematic view of a charging system 1 according to various exemplary embodiments. The charging system has a charging station 1 including a buffer storage device 2 for storing energy. Furthermore, power electronics 3 are arranged in the charging station 1, power electronics being understood to mean the combination of all of the electrical and electronic components that are involved in providing energy from the buffer storage device 2 and/or the mains connection in order to charge an electric vehicle. The charging station 1 furthermore includes power electronics 3, which use a necessary voltage conversion and possible current conversion to provide a charging current, by way of which an electric vehicle connected to the charging station 1 via a charging connector 5 is able to be charged. Although only one charging connector 5 is shown in FIG. 1, more charging connectors may obviously be provided. In addition, the at least one charging connector 5 may also be arranged, instead of directly on the charging station 1, on a charging column positioned remotely from the charging station 1, which charging column is electrically coupled to the charging station 1 and at which charging column the charging current is output.

The charging station 1 according to aspects of the invention furthermore includes a coolant reservoir 4, which is preferably installed underground. A coolant, for example water, is stored in the coolant reservoir 4, which coolant is able to be used to cool the power electronics 3 and also preferably the buffer storage device 2. The cooling procedure is indicated by the double-headed arrow shown in FIG. 1 and may essentially represent a cooling system that undertakes cooling of the buffer storage device and of the power electronics on the basis of the coolant from the coolant reservoir 4. As already explained, the cooling of the corresponding system may take place directly or indirectly.

An underground arrangement of the coolant reservoir 4 may be understood to mean for example immersion of the coolant reservoir 4 or of the housing part or building part of the charging station 1 in the ground at the site of installation of the charging station 1, which includes the coolant reservoir 4. The cooling system, which is represented by the two double-headed arrows, may additionally be used to cool the charging cable of the charging connector 5.

Figure 2:
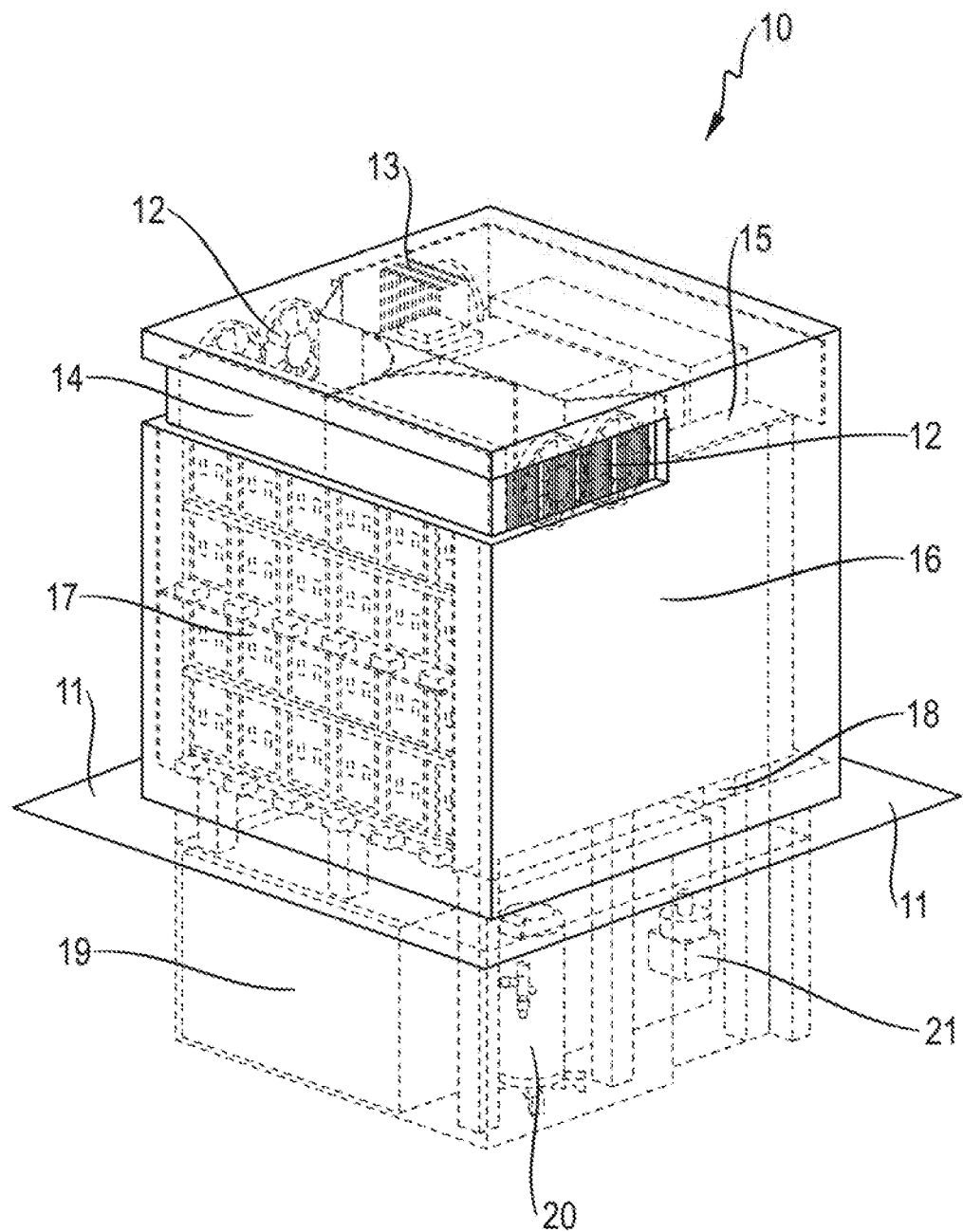
FIG. 2 shows one embodiment of the charging station of the charging system according to aspects of the invention.
Figure 3:
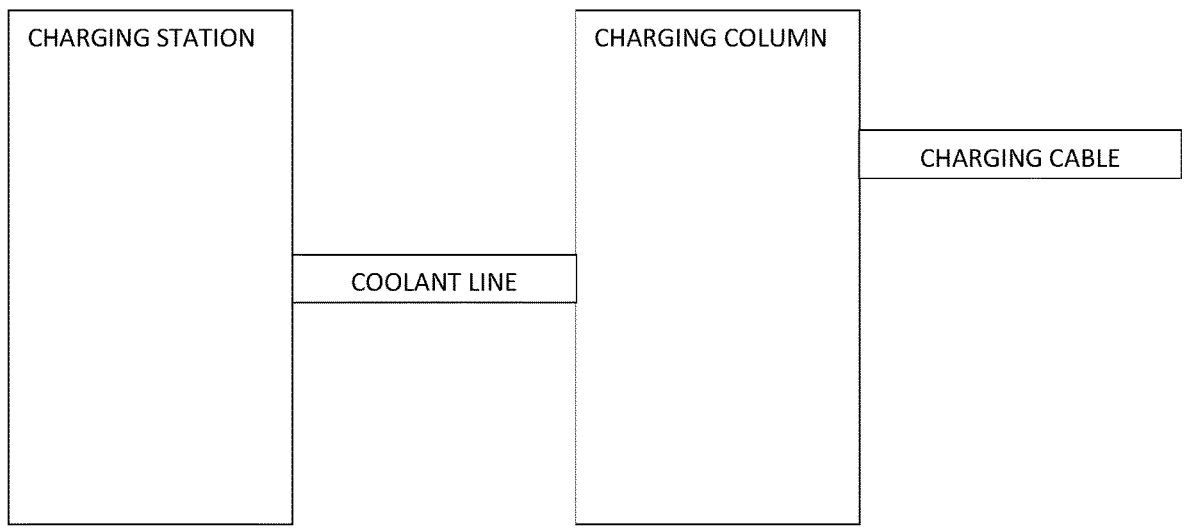
FIG. 3 shows a charging column connected to a charging station.

FIG. 2 shows one specific exemplary implementation of the charging station 10 of the charging system according to aspects of the invention. Depending on the number and dimension of the components inside the charging station 10, its size may vary. An exemplary area of the charging station 10 may be in the range from about 1 to about 10 m², and an exemplary overall height (that is to say including a potential underground part) may be in the range from about 1 to about 4 m. The charging station 10 may be arranged for example half in the ground at the site of installation. The charging station 10 illustrated by way of example in FIG. 2 has a cuboid form, which does not constitute an absolute requirement. Blowers 12 may be arranged in the upper part of the charging station 10, which blowers provide a circulation of air in a region of the charging station 10 in which the condenser 14 of the cooling system is arranged. The gaseous overheated coolant is cooled in the condenser 14. A first heat exchanger 13 may furthermore be arranged in the upper region of the charging station 10, which heat exchanger is a liquid-to-air heat exchanger for the power electronics (the power electronics are not shown explicitly in FIG. 2). By way of the first heat exchanger 13, heat is removed from the air heated by the power electronics inside the charging station 10 and transferred to the coolant. There is no ejection, out of the charging station 10, of hot exhaust air that has been heated directly by the power electronics. In particular, the air stream produced by the blowers 12 does not serve to aerate that region of the charging station 10 in which the power electronics are arranged. As illustrated in FIG. 2, the region that includes the power electronics is separated, by a separating wall, from the region in which the condenser 14 of the cooling system is situated. The power electronics are thus cooled by way of liquid cooling, and not by the ejection of hot exhaust air out of the charging station 10. In addition to the first heat exchanger 13, heat sinks that are coupled to the cooling system may obviously be provided, which heat sinks are attached directly to components of the power electronics that are particularly affected by overheating. The power electronics may additionally be cooled by way of a cooling plate 15, which, for its part, is able to be cooled by convection or by way of a heat sink.

The buffer storage device 17 is arranged in the central region of the exemplary charging to station 10. The buffer storage device 17 may include an arrangement of battery cells and/or battery modules. Furthermore, to the side of the battery arrangement of the buffer storage device 17, there is provided a region 16 for piping, in which region for example lines and components of the cooling system are able to be arranged (these are not illustrated explicitly). These components may serve to convey the coolant from the coolant reservoir 19 to the power electronics and preferably to the buffer storage device 17 and then guide it back to the coolant reservoir 19. The region 16 may be externally accessible to qualified personnel for maintenance purposes via a door or by flaps of a cover. A second heat exchanger 18 is arranged in the region of the buffer storage device 17, which heat exchanger is a coolant-to-air heat exchanger for the buffer storage device 17. By way of the second heat exchanger 18, heat is removed from the air heated by the buffer storage device 17 inside the charging station 10, and transferred to the coolant. A direct ejection of hot air originating from the buffer storage device 17 out of the charging station 10 then does not occur, or is able to occur with a time delay following the production of the hot exhaust air. As an alternative, the cooling of the buffer storage device 17 may additionally or only be performed by way of air cooling.

The coolant reservoir 19, for example a water tank, is arranged in the lower region of the charging station 10. A compressor 20 and at least one pump 21 are furthermore provided. The liquid cooling system may in each case have a separate cooling branch for the buffer storage device 17, the power electronics and the charging connector 5. Each of these cooling branches may therefore have its own pump 21 for conveying the coolant. The cooling branches may however also be combined in any desired manner. As illustrated in FIG. 2, the lower part of the charging station 10, which essentially includes the coolant reservoir 19, is situated underground 11 and is thus surrounded by the ground, which takes on the role of a thermally insulating/stabilizing body. The coolant tank 19, in the case of an arrangement in the ground, is protected in particular against a direct effect of solar radiation. If necessary, the lower part of the charging station 10 may be separated therefrom and arranged deeper in the ground in order to utilize the cooling or temperature control effect of the ground to an even greater extent.

What is claimed is:

1. A charging system for charging an electric vehicle, said charging system comprising:
   a charging station including a housing;
   a charging cable having at least one charging connector that is configured to be coupled to the electric vehicle in order to charge the electric vehicle;
   a buffer storage device for storing energy, the buffer storage device being disposed in a first region of the housing;
   power electronics that are disposed in a second region of the housing that is separated from the first region, the power electronics being configured to distribute energy from at least one of the buffer storage device and a mains connection to the charging station at the at least one charging connector;
   a coolant reservoir in which a coolant for cooling the power electronics is stored;
   a first heat exchanger positioned in the first region of the housing for removing heat within the first region that is produced by the buffer storage device;
   a second heat exchanger positioned in the second region of the housing for removing heat within the second region that is produced by the power electronics; and
   a condenser and a blower positioned in the second region of the housing, wherein the condenser is fluidly connected to the coolant reservoir and separated from the power electronics by a separating wall, and the blower is not configured to eject heat outside of the housing.

2. The charging system as claimed in claim 1, wherein the coolant is used to cool at least one of the buffer storage device and the charging cable directly or indirectly.

3. The charging system as claimed in claim 1, further comprising a charging column that is electrically coupled to the charging station, wherein the at least one charging connector is disposed on the charging column.

4. The charging system as claimed in claim 3, wherein the at least one charging connector is arranged on the charging column and a coolant line is arranged in a connecting line between the charging column and the charging station, which coolant line is coupled to the coolant reservoir in order to actively cool the connecting line.

5. The charging system as claimed in claim 1, wherein the coolant includes water.

6. The charging system as claimed in claim 1, wherein the coolant reservoir is arranged underground.

7. The charging system as claimed in claim 1, wherein at least part of the buffer storage device is arranged underground.

8. The charging system as claimed in claim 1, wherein the charging connector includes a coolant line that is coupled to the coolant reservoir in order to actively cool the charging connector.

9. The charging system as claimed in claim 1, wherein the coolant reservoir has a capacity of at least 100 liters per charging connector.

10. The charging system as claimed in claim 1, wherein the cooling system is configured to use the coolant for heating such that the cooling system constitutes a temperature control system.

11. The charging system as claimed in claim 1, wherein the power electronics are configured to distribute energy from the buffer storage device and the mains connection.

12. The charging system as claimed in claim 1, wherein the second heat exchanger is a cooling plate that is configured to transfer thermal energy from hot air in the second region to the coolant.

13. The charging system as claimed in claim 1, wherein the first heat exchanger is a cooling plate that is configured to transfer thermal energy from hot air in the first region to the coolant.

* * * * *